US010982975B2

(12) United States Patent
Elliott

(10) Patent No.: US 10,982,975 B2
(45) Date of Patent: Apr. 20, 2021

(54) DUTY CYCLE FOR INDUCTIVE POSITION SENSORS

(71) Applicant: KSR IP Holdings, LLC, Wilmington, DE (US)

(72) Inventor: Ryan W. Elliott, Chatham (CA)

(73) Assignee: KSR IP Holdings, LLC, Wilmington, DE (US)

( * ) Notice: Subject to any disclaimer, the term of this patent is extended or adjusted under 35 U.S.C. 154(b) by 386 days.

(21) Appl. No.: 15/939,781

(22) Filed: Mar. 29, 2018

(65) Prior Publication Data

US 2019/0128703 A1   May 2, 2019
US 2020/0033161 A9   Jan. 30, 2020

Related U.S. Application Data

(63) Continuation-in-part of application No. 15/802,202, filed on Nov. 2, 2017, now Pat. No. 10,408,642.

(60) Provisional application No. 62/416,561, filed on Nov. 2, 2016.

(51) Int. Cl.
    | | |
    |---|---|
    | *G01D 5/20* | (2006.01) |
    | *H03K 5/156* | (2006.01) |
    | *G01D 3/028* | (2006.01) |

(52) U.S. Cl.
    CPC .......... *G01D 5/2053* (2013.01); *G01D 3/028* (2013.01); *G01D 5/204* (2013.01); *H03K 5/1565* (2013.01)

(58) Field of Classification Search
    CPC ... H02J 1/00; H01F 1/00; H01L 21/00; H01L 2221/00
    See application file for complete search history.

(56) References Cited

U.S. PATENT DOCUMENTS

| | | | |
|---|---|---|---|
| 4,922,199 A | 5/1990 | Fukui et al. | |
| 5,138,118 A * | 8/1992 | Russell ................... | G06F 3/046 |
| | | | 178/19.03 |
| 5,227,704 A * | 7/1993 | Erdman ................... | F23N 3/082 |
| | | | 318/400.34 |
| 6,005,387 A | 12/1999 | Andermo et al. | |
| 6,603,306 B1 | 8/2003 | Olsson et al. | |

(Continued)

FOREIGN PATENT DOCUMENTS

JP          H06229707 A        8/1994

OTHER PUBLICATIONS

International Search Report dated Mar. 21, 2018; PCT/US2017/059752 filed on Nov. 2, 2017.

(Continued)

*Primary Examiner* — Jermele M Hollington
*Assistant Examiner* — Temilade S Rhodes-Vivour
(74) *Attorney, Agent, or Firm* — Dinsmore & Shohl LLP

(57) ABSTRACT

A duty cycle is used in conjunction with a powered oscillator to electronically reduce the current draw by reducing the average current and thus reducing the sensor radiated emissions without altering an inductive position sensor. The duty cycle and the switching of the oscillation drive enable an on and an off cycling of the inductive position sensor such that an oversampling may occur without altering the hardware, but providing the improvements. As such, the inductive position sensor may only have an oscillation signal long enough to capture a stable sample and remain off for the duration of the sampling period. As such, a reduction in radiated emissions is achieved.

20 Claims, 11 Drawing Sheets

(56) References Cited

U.S. PATENT DOCUMENTS

| | | |
|---|---|---|
| 7,443,154 B1 | 10/2008 | Merewether et al. |
| 7,446,443 B2 | 11/2008 | Naganuma et al. |
| 7,538,544 B2 | 5/2009 | Lee |
| 8,098,061 B2 | 1/2012 | Elliott et al. |
| 8,508,242 B2 | 8/2013 | Shao et al. |
| 2005/0253576 A1 | 11/2005 | Nyce |
| 2012/0293166 A1* | 11/2012 | Lee ........... G01D 5/2046 324/207.17 |
| 2013/0119773 A1* | 5/2013 | Davis ........... H02J 50/70 307/104 |
| 2014/0232408 A1* | 8/2014 | Candy ........... G01V 3/104 324/329 |
| 2015/0001960 A1 | 1/2015 | Niizuma |
| 2016/0329748 A1 | 11/2016 | White, II et al. |

OTHER PUBLICATIONS

Extended European Search Report dated May 12, 2020; European Application No. 17866739.0.

* cited by examiner

DUTY CYCLE FOR INDUCTIVE POSITION SENSORS

CROSS-REFERENCE TO RELATED APPLICATIONS

This application is a continuation in part of U.S. patent application Ser. No. 15/802,202 filed on Nov. 2, 2017, which in turn claims priority benefit of the U.S. Provisional application for Patent Ser. No. 62/416,561, filed on Nov. 2, 2016, under 35 U.S.C. 119(e), which are incorporated herein in their entirety by reference.

FIELD OF THE INVENTION

The present invention relates to position sensor emissions and, more specifically, using a duty cycle to control a position sensor emissions.

BACKGROUND OF THE INVENTION

In the automotive field, position sensors are well known in the art. A typical arrangement has a single exciter and multiple receiving coils positioned at some gap apart from each other such that a coupler creates eddy currents in the receiving coil under constant excitation. Other position sensors known in the art function as an air-core transformer. A position sensor that functions as the air-core transformer, at its simplest, includes an excitation coil, an output coil, and a sensor coil. The excitation coil is electrically excited with an excitation signal. The output coil is inductively coupled to the excitation coil upon electrical excitation of the excitation coil. The sensor coil is electrically shorted and upon electrical excitation of the excitation coil, is inductively coupled to at least one of the excitation coil or the output coil.

Other known variations of position sensors include a signal source, an excitation coil, an output coil or a plurality of differently wound output coils, and a sensor coil. The signal source is operable to supply an excitation signal. The excitation coil is coupled to receive the excitation signal. The output coil is inductively coupled to the excitation coil upon excitation of the excitation coil with the excitation signal, to thereby supply an output signal. The sensor coil is electrically shorted and upon excitation of the excitation coil with the excitation signal, is inductively coupled to at least one of the excitation coil or the output coil, thus the output signal varies with movement of the sensor coil.

Example inductive position sensing units such as those disclosed in U.S. Pat. Nos. 7,538,544, 7,446,443, 8,098,061 and 8,508,242 may disclose a constant powered oscillator used to power the position sensor. However, as seen in these oscillating position sensors, which generally, include an air gap, there is a large amount of radiated emissions that occur at the operating frequency. As a result, emission standards have been established to set peak and average emission limits. The peak emission limit is set by the maximum amplitude of the oscillation, whereas the average is set by how long the oscillation is active over a set amount of time. Generally, for sampling and complexity reasons, the DC power oscillator is constantly on; however, with the new emission standards, particularly in Europe, there is peak and average emission limits between the AM radio and a 5 MHz frequencies that position sensors must now not exceed to pass the standards.

As such, it is desirable to control the inductive position sensor's peak and average emission values without comprising performance.

SUMMARY OF THE INVENTION

A position sensor system includes an inductive position sensor and a control unit. The position sensor is configured to have a constant excitation upon a single exciter and at least one receiving coil. The control unit includes an oscillator drive. The control unit is operably connected to control a signal from the oscillator drive to the position sensor. Further, the control unit is configured to control a start duty cycle and a stop duty cycle. The start duty cycle is configured to initiate the signal to the oscillator drive, which in turn collects a sample from the position sensor. The stop duty cycle is configured to inhibit the oscillator drive, which in turn shuts off the position sensor. The start duty cycle and the stop duty cycle operate at a predefined frequency and a predefined ratio to provide the sample the position sensor. The pulse of the start duty cycle and the stop duty cycle is configured to reduce an average radiated emission.

BRIEF DESCRIPTION OF THE DRAWINGS

Reference will now be made to the attached drawings, when read in combination with the following detailed description, wherein like reference numerals refer to like parts throughout the several views, and in which.

DETAILED DESCRIPTION OF THE PREFERRED EMBODIMENTS

Figure 1:
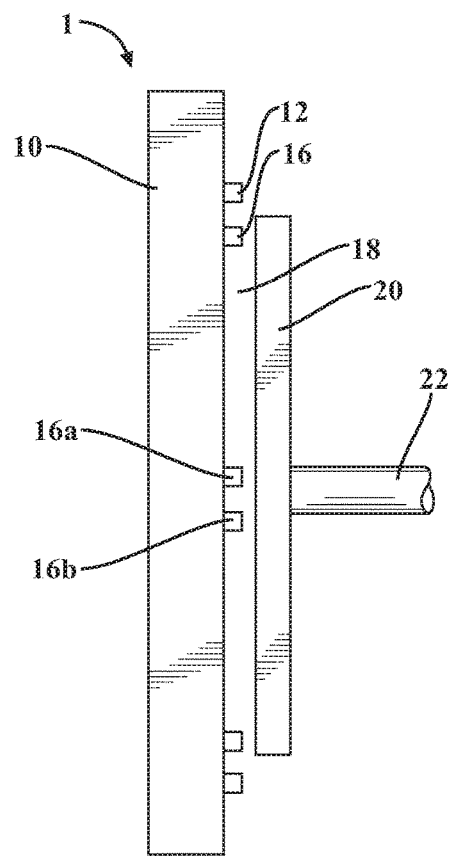
FIG. 1 schematically depicts a side view of an example inductive position sensor, according to one or more embodiments shown and described herein.

A position sensor system includes an inductive position sensor and a control unit. The position sensor is configured to have a constant excitation upon a single exciter and at least one receiving coil. The control unit includes an oscillator drive. The control unit is operably connected to control a signal from the oscillator drive to the position sensor. Further, the control unit is configured to control a pulse width modulation, which includes a start duty cycle and a stop duty cycle. The duty cycle may be independent from the signal generated from the oscillator drive. The oscillator drive is switched on and off during a predetermined period between the start duty cycle and the stop duty cycle so to collect a sample from the inductive position sensor. The duty cycle is used in conjunction with the oscillator drive to electronically oversample the position sensor system to a predetermined output data rate to allow the system to be shut off, which results in a reduction in the current draw by reducing the average current and thus reducing the sensor radiated emissions without altering the inductive position sensor. The duty cycle and the oscillator drive enable an on and an off cycling without altering the hardware, but providing the improvements as described herein.

In representative examples, the inductive position sensor includes a transmitter coil and a receiver coil, both formed by printed circuit techniques on printed circuit hoard. Inductive coupling between the transmitter coil and receiver coil induces a receiver signal in the receiver coil when the transmitter coil is excited, for example by an alternating current source. A coupler element, attached to the movable object, spatially modifies the inductive coupling between the transmitter coil and the receiver coil, allowing the receiver signal to be used to find the position of the movable object.

Inductive position sensors are described that employ a transmitter coil (sometimes called an exciter coil) powered by a current source, a receiver coil (or pickup coil) for generating an induced signal in response to the time varying magnetic field generated by the transmitter coil, and an electrically conductive element positioned proximate to the coils such that the time varying magnetic field generates eddy currents in the coupler element which modify the currents induced in the receiver as a function of the position of the coupler element.

The coupler element is connected to a movable part whose position is to be measured, such as the throttle pedal of an automotive vehicle, such that the angular (or rotational) position of the couplet is a function of the position of the throttle element. Thus, the voltage induced in the receiver or pickup coil is varied; by detecting the received voltage, the position of the coupler element, and thus the throttle pedal may be determined. This signal may be used to control the speed of the vehicle engine.

In one example, the transmitter coil, receiver coil, and the reference coil are printed on a printed circuit board, which may be a multi-layer printed circuit board. In other examples, the coils can be formed on separate structures.

In each of these inductive position sensors, there is an airgap between a board and a coupling. The larger the gap, the lower the coupling, and the lower the received signals. It is within this airgap that causes the emissions problems. When the airgap is maintained at a lower value, there is a reduction in emissions, thus a reduction is the peak and average radiated emissions. As the gap is increased so does the radiated emissions. A low physical airgap however is not feasible to be manufactured in mass at a low cost. Hence, the need for the positon sensor that is able to control the emissions produced by the airgap and to be manufactured in mass quantities at a low cost.

In addition, the excitation signal is used to generate a sensed signal, which allows the current configuration of the duty cycled inductive position sensor to operate on systems in the 2 KHz or less range and provides an advantage of also using the high operating frequency, generally in the 4 MHz range. Furthermore, using the excitation signal permits the output data to transfer at the slower rate using modulation, while still using a higher sample rate internally.

Further, the duty cycle power oscillation reduces a current draw from a total current used by an application specific integrated circuit (ASIC) and a tail current. As a result, the radiated emission from the sensor relative to the oscillation is reduced without comprising performance.

Given the above, and referring to the attached illustration, FIG. 1 schematically depicts an example inductive position sensor. The inductive position sensor 1 includes a first transmitter coil 12 and a first receiver coil 16, both formed by printed circuit techniques on a PCB (printed circuit board) 10. However, it should be appreciated that the PCB does not have to be printed. Inductive coupling between the first transmitter coil 12 and the first receiver coil 16 induces a receiver signal in the first receiver coil 16 when the first transmitter coil 12, is excited for example by an alternating current source. A first coupler element 20, attached to the movable object, spatially modifies the inductive coupling between the first transmitter coil 12 and the first receiver coil 16, allowing the receiver signal to be used to find the position of the movable object.

The first coupler element 20, formed of an electrically conductive material, supported substantially parallel to and proximate to the PCB 10, thus creating a first airgap 18 between the first coupler element 20 and the PCB 10. The first transmitter coil 12 consists of one or more imprinted loops having a generally semicircular configuration, formed on the PCB 10. An oscillator drive 14 (shown in FIG. 3), which may be formed on the same PCB and may be controlled by an electronic control unit 58 (shown on FIG. 3), is connected to the transmitter coil and provides a current (the excitation signal) to the transmitter coil, generating an alternating electromagnetic field, which subsequently induces signals in other proximate coils through inductive coupling.

The first receiver coil 16 has an outer perimeter, which is preferably within the area defined by the first transmitter coil 12. In this example, the receiver coil includes first and second loop configurations, 16a and 16b, each of which represents an approximately 54 degree sector of a circular area. The two loops 16a and 16b are connected by a reversing connection (not illustrated), with no electrical connection between the crossing electrical conductors. This receiver coil is configured such that if a current flows in the first receiver coil 16, the current would flow in reverse directions in the sections 16a and 16b. When a clockwise current flows in section 16a, a counterclockwise current flows in section 16b. The first coupler element 20 is rotated around a shaft 22 by connecting member (not shown) in a plane substantially parallel to the plane of the transmitter and receiver coils.

Figure 2:
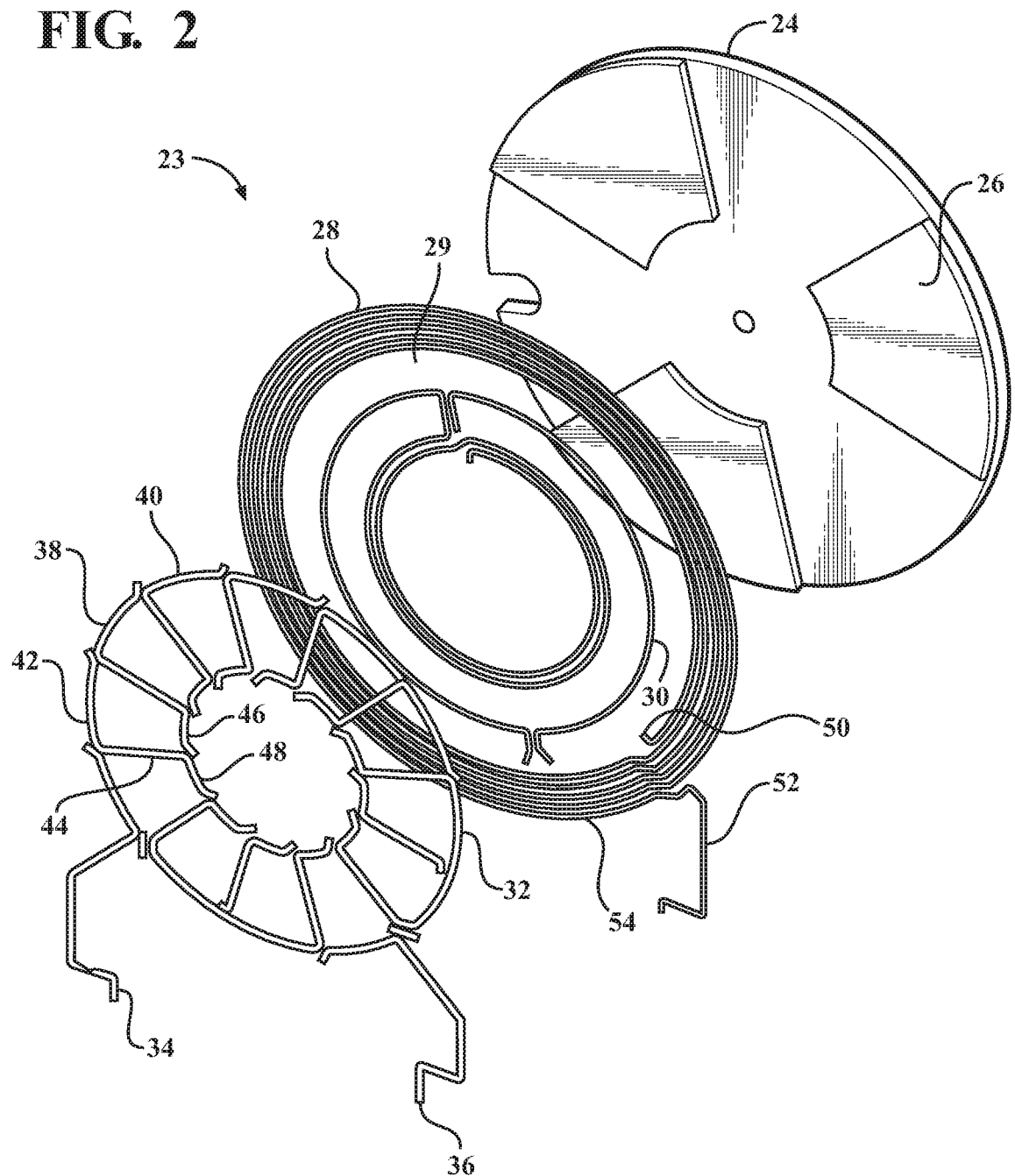
FIG. 2 schematically depicts another example of an inductive position sensor, according to one or more embodiments shown and described herein.

FIG. 2 illustrates a further example of a second inductive position sensor 23, including a rotating disk 24 having a plurality of electrically conducting patches, such as a second coupler element 26. The second inductive position sensor 23 further includes a second transmitter coil 28, a reference coil 30, and a second receiver coil 32. The second transmitter coil 28 is proximate to the second coupler element 26 so to form a second airgap 29 between the second transmitter coil 28 and the second coupler element 26. The second transmitter coil 28 is excited by a current source (not illustrated) connected to the transmitter coil ends 50 and 52. The excited transmitter coil generates an electromagnetic field, which induces signals in the reference coil 30 and the second receiver coil 32 by inductive coupling. The inductive coupling between the second transmitter coil 28 and both the reference coil 30 and the signal coil is modified (reduced) by the coupler elements such as the second coupler element 26. However, the inductive coupling between the transmitter coil and the reference coil is not sensitive to the angular position of the rotating coupler. In contrast, the receiver signal is sensitive to the angular position of the rotating disk 24, so that a ratio of the receiver signal and the reference signal is correlated with the angular position of the rotating coupler while also being corrected for common mode factors, such as the gal, between the transmitter coil and the rotating disk. The receiver signal is obtained between receiver coil ends 34 and 36.

The outer periphery of the second receiver coil comprises sequential segments, such as 42, 38, and 40, in which sequential segments alternate as being part of a first loop configuration or a second loop configuration. For example, outer segment 38 is part of the same loop configuration as inner segment 46, connected by a radial spoke 44, both part of a first loop configuration, whereas outer segments 40, 42, and inner segment 48 are pail of a second loop configuration. As illustrated, a radial spoke such as 44, part of the second loop configuration, conceals a second radial spoke behind it, the concealed spoke being part of the first loop configuration. The two loop configurations are interconnected by a reversing connection so that a first signal in the first loop configuration, and a second signal in the second loop configuration, oppose each other, and may cancel out if the inductive coupling to each of the two loops is the same. The cancellation may occur, for example, if the rotating coupler is removed. In position sensor applications, if the rotating coupler element can move to a position where the inductive coupling to one loop configuration is reduced, and the inductive coupling to the other loop configuration is increased, changing the receiver signal in a manner correlated with coupler element position.

In this example, the first loop configuration comprises a number of radially extending lobes, formed by an inner segment, a radial spoke, an outer segment, a radial spoke, an inner segment, and so on. The radial lobes of the first and second loop configurations alternate within the second receiver coil shown in FIG. 2. In addition, as shown in the example FIG. 2, the second coupler element is a segment having an angular width twice the angular width of a radial lobe of the first or second loop configurations. As shown, the second receiver coil substantially entirely formed of radial conductors, or elements orthogonal to a radial direction.

Figure 3:
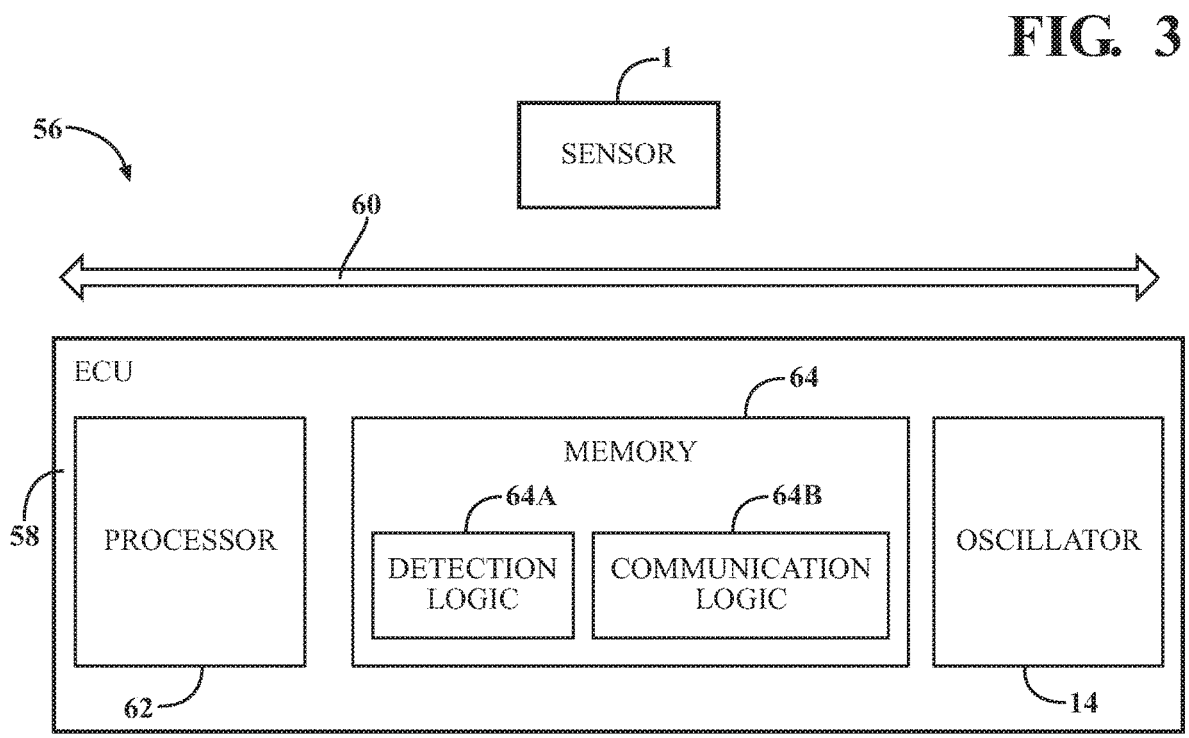
FIG. 3 schematically depicts an environment of a system for controlling the inductive position sensor, according to one or more embodiments shown and described herein.

FIG. 3 schematically depicts an environment of a system for controlling the inductive position sensor, such as the inductive sensor of FIG. 1 or 2. As illustrated, the system 56 includes the inductive position sensor 1, in communication with an electronic control unit 58 and a transceiver 60. The transceiver 60 is in electrical communication with the electronic control unit 58 and is connected to the inductive position sensor 1, to couple the electronic control unit 58 to the inductive position sensor 1.

As depicted in FIG. 3, the electronic control unit 58 includes the oscillator drive 14, a processor 62 and a memory component 64 coupled to the processor 62. The memory component 64 stores logic, such as, a detection logic 64a, and a communication logic 64b, as illustrated in FIG. 3. Moreover, the oscillator drive 14 may generate an oscillation signal and a pulse-width modulation signal in which the pulse-width modulation has a duty cycle, as described in detail herein. The pulse-width modulation may be a signal wave with a fixed frequency. The duty cycle includes a start duty cycle and a stop duty cycle so to vary the amount of time the oscillation signal may be driven to the inductive position sensor 1.

Figure 4:
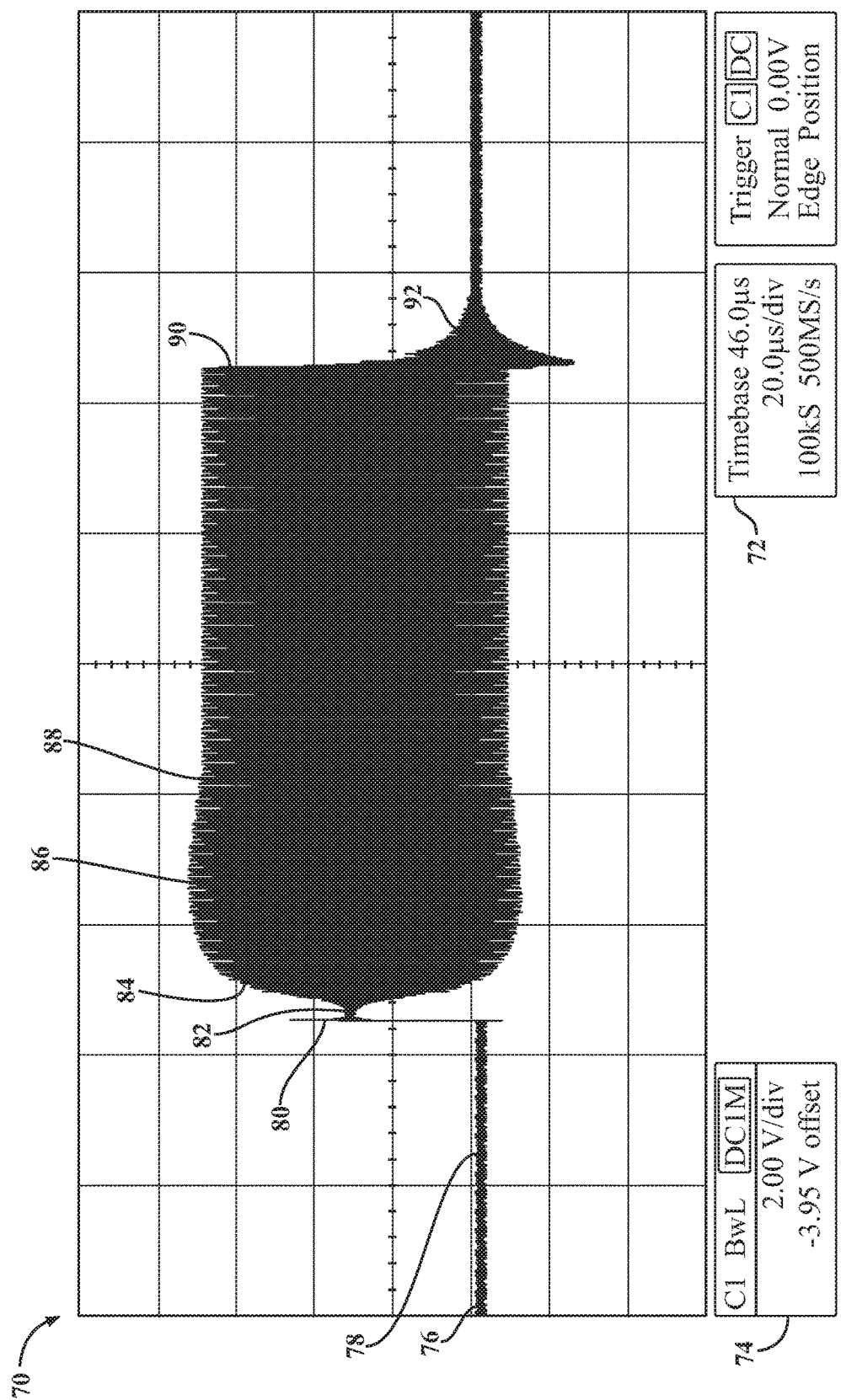
FIG. 4 is a characteristic curve of a 10% duty cycle, according to one or more embodiments shown and described herein.

FIG. 4 generally depicts a characteristic curve of the duty cycle as a periodic clock signal at 10%. The 10% duty cycle is from the pulse width modulation signal, which is generated from the oscillator drive 14. The 10% duty cycle driven by the pulse width modulation as described herein may be operably connected to the example inductive position sensor 1 having a first airgap 18 between the PCB (sensing board) 10 and the first coupler element 20 or the example second inductive sensor 23 having a second airgap 29 between the second transmitter coil 28 and the second coupler element 26. It should be appreciated that the duty cycle is not limited to these two inductive sensors and may be applied to any inductive sensor having an airgap. Further, it should also be appreciated that the larger the airgap, the lower the coupling and the lower strength of signal received. Therefore, to compensate, the control current is varied to increase the excitation voltage to maintain a constant input voltage on the received signal side of the position sensor. Moreover, the current supplied to power the oscillation is a tail current denoted in milliamps (mA).

The characteristic curve 70 of the pulse width modulation's duty cycle at 10% is shown over a pulse width period 72 of a predetermined implementation amount of time, such as, without limitation, 800 μs. It should be appreciated, and shown in FIGS. 7-12 below, that the predetermined implementation amount of time may range from 200, 400, 800 hertz (Hz) or ⅛, ¼, and ⅛ respectively of a nominal 1600 Hz data rate. Further, the predetermined implementation amount of time, as illustrated here in FIG. 4 corresponds from a first edge 84 to a second edge 90. It should also be appreciated that the first edge 84 and the second edge 90, while illustrated over a set period of time, does not necessary need to be set at a known period and only require a minimum of time to allow the oscillation to become established to allow for a stable reading of the received signals; thus, an off time may be variable. Further, the characteristic curve is illustrated with the voltage parameters 74 of a 2.00 V/div and −3.95 V offset, however, these parameters should not be indicative of limiting the scope of the claims and are merely for illustrative purposes. Further, it should be appreciated that the time between sequential second edge 90 to the first edge 84, or from the beginning of on period until the next on period is but may be any interval of time, as shown in FIGS. 7-12 below, and as those skilled in the art would appreciate.

Initially the curve 70 is illustrated between periods where the electronic control unit 58 is not enabling a current 76 or the oscillation signal to be high or generated from the oscillation drive 14 and the duty cycle may or may not be active; thus, the current 76 or the oscillation is not being applied by the oscillator drive 14. Therefore, the current and modulation is maintained at a baseline 78. When the electronic control unit 58 enables the current 76 high so to power the oscillator drive 14, which in turn spikes 80 upon excitation of the inductive position sensor 1. Almost simultaneously, as illustrated here in FIG. 4, when the current 76 powers the oscillator drive 14 with constant DC current 82, the duty cycle also happens to be high, therefore the signal is modulated at the first edge 84. The oscillation peaks 86 but the oscillation settles and becomes established 88 over the pulse width period 72 (remainder of curve until second edge 90) to allow for the stable reading of the received signals modulation. During this period of stable reading, a sample is being taken and held onto in the electronic control unit 58 until another sample is taken. It should be appreciated that the sample being taken and held onto until another sample is taken is generally in analog systems. For digital output systems, generally, the digital output rate may be at the lower rate or the system may hold or repeat multiples of the same value. It should also be appreciated that while 10% modulation is shown in the figures and described for ease of the reader, it is in no way limiting and the duty cycle (shown in FIG. 5) may be anywhere from 0% to 100%.

When the pulse width period 72 is reached, the electronic control unit 58 inhibits the oscillator drive 14, thus the modulation ends at the second edge 90 and the current 76 returns to an oscillation 92 near the baseline 78 until the current 76 settles along the baseline 78 until the next pulse width period 72 and oscillator drive 14 are both enabled.

It should be appreciated that the operating frequency may vary Further, as a result of the modulation, a peak value of radiated emission and the average radiated emission 98 (shown in FIG. 5) between edges 84 and 90, reduces the oscillation and thus reduces the average radiated emissions 98 (shown in FIG. 5) from the inductive position sensor 1. Moreover, it should be appreciated that the sensor current draw is reduced because the average current reduced due to the cycling of power to the sensor. The sampling collected during the modulation exceeds the predetermined required output data rate therefore the sampling process does not need to occur at 100% but may be reduced which in turn reduces the inductive position sensor 1 current draw and the sensor radiated emissions related to the oscillation.

Figure 5:
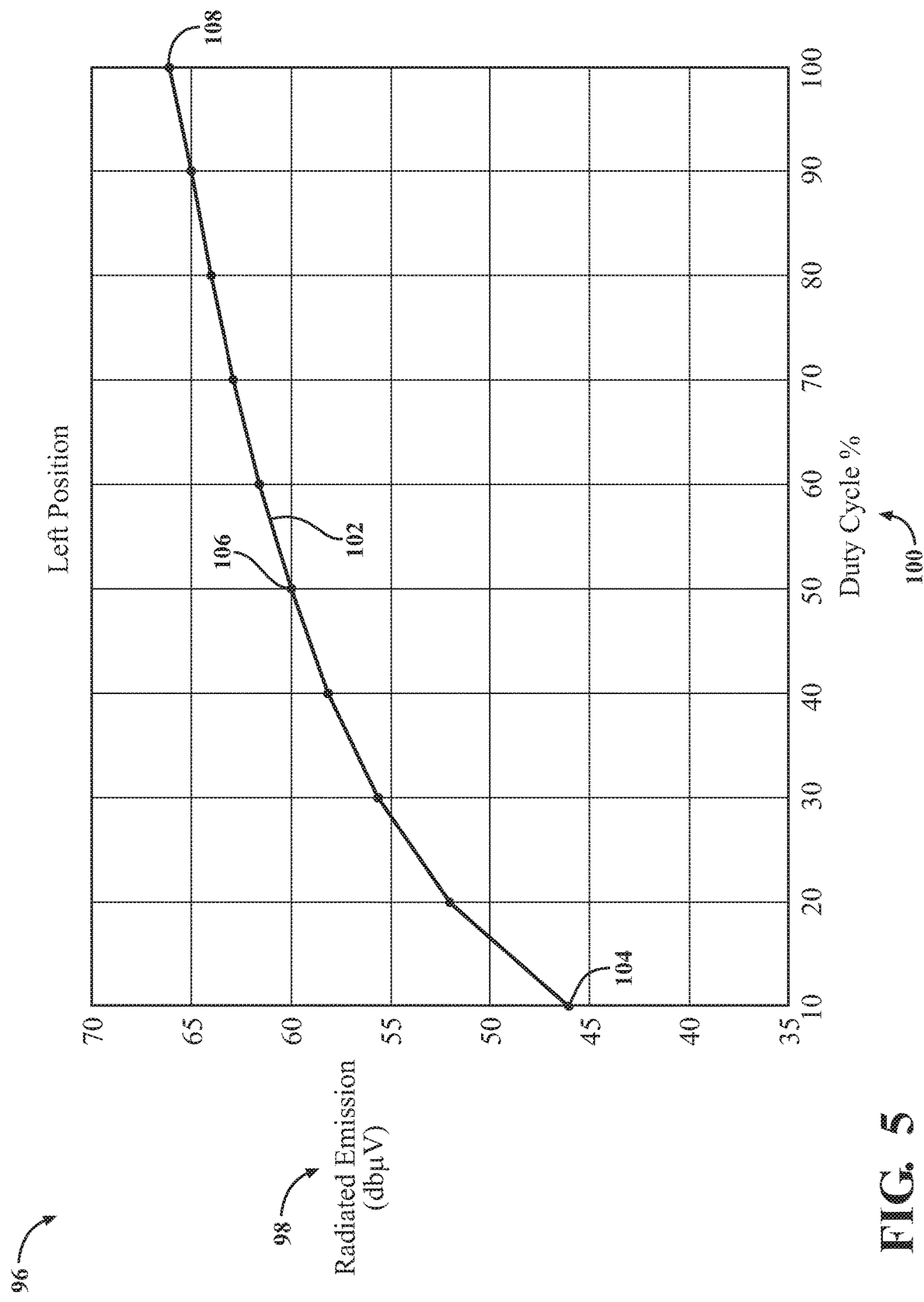
FIG. 5 is a characteristic curve of an average radiated emission versus the duty cycle percentage, according to one or more embodiments shown and described herein.

With reference to FIG. 5 now, a characteristic curve of the average radiated emission 98 versus the duty cycle percentage 100 is depicted. The graph 96 is plotted as the average radiated emission (dbµV) 98 (abscissa coordinate) versus the duty cycle percentage 100 (ordinate coordinate) curve. As shown, the plot forms a continuously increasing curve 102 where a tangent to the curve is positive from any duty cycle percentage 10% through 100%. It should be appreciated that while the duty cycle percentage 100 is graphed between 10% and 100%, the duty cycle percentage 100 may be less than 10%. As the duty cycle percentage 100 increases, so does the average radiated emission 98.

As an example, the duty cycle percentage 100 at 10% intersects the average radiated emission 98 at intersection 104, which indicates that, at this duty cycle percent, the average radiated emission is approximately 46 dbµV. On the other hand, the duty cycle percentage 100 at 50% intersects the average radiated emission 98 at intersection 106, which indicates that, at this duty cycle percent, the average radiated emission is approximately 60 dbµV. Further, in another example, the duty cycle percentage 100 at 100% intersects the average radiated emission 98 at intersection 108, which indicates that, at this duty cycle percent, the average radiated emission is approximately 67 dbµV. Therefore, there is a correlation ratio between the duty cycle percentage 100 and the average radiated emissions 98. For example, the 10% duty cycle on the position sensor produces the average radiated emissions of approximately 46 dbµV while the 100% duty cycle, i.e. constant on, produces the average radiated emissions of approximately 67 dbµV.

The correlation has a reduction in dB directly correlating with the ratio of on to off time. Specifically, the reduction in the average radiated emissions 98 follows the standard Log 20 curve in dB. For example, at 50% duty cycle percentage 100, the average radiated emissions 98 equates to a −6 dB drop, as compared to constant on (i.e. 100% duty cycle), at 25% duty cycle percentage 100 there is an additional 6 dB drop in the average radiated emissions 98 and at 10% there is 20 dB ([20 Log (0.1)]) drop in the average radiated emissions 98.

As discussed previously, the emission standards have been established to set a peak and average emission limits. The peak emission limit is set the maximum amplitude of the oscillation, whereas the average is set by how long the oscillation is active over a set amount of time. Therefore, by controlling the average radiated emissions 98, the standards, particularly for Europe, may be met.

Figure 6:
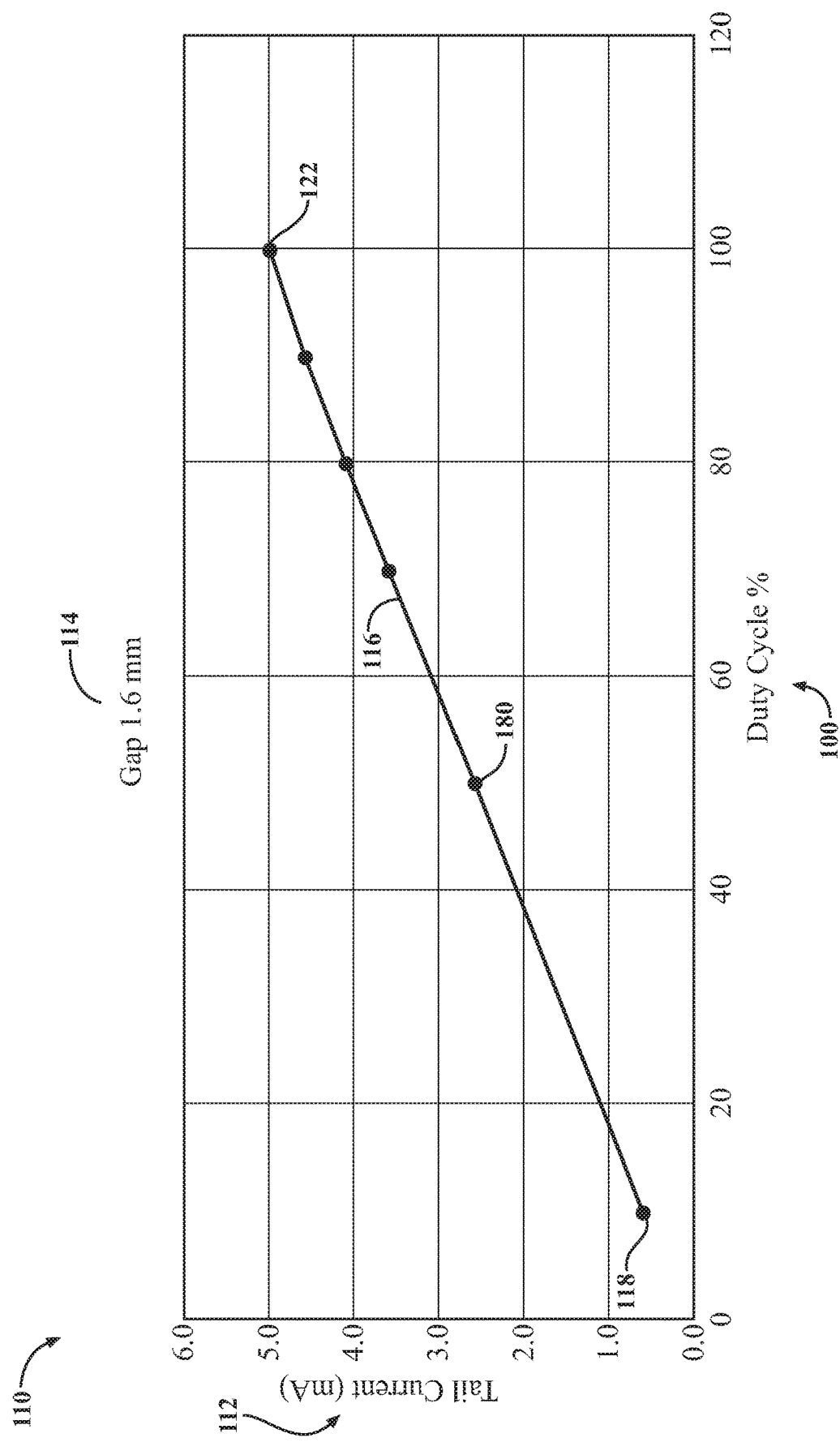
FIG. 6 is a characteristic curve of a current versus the duty cycle percentage of FIG. 1, according to one or more embodiments shown and described herein.

Now referring to FIG. 6, a characteristic curve of a current versus the duty cycle percentage is depicted. The graph 110 is plotted as the current (mA) 112 (abscissa coordinate) versus the duty cycle percentage 100 (ordinate coordinate) curve at the airgap 114 of 1.6 mm. It should be appreciated that the airgap 114, the distance between the sensor board and the coupler or the gap between the transmitter coil and the coupler element, may be greater or less than 1.6 mm. For illustrative purposes and not to limit the claims, the 1.6 mm gap is being used. It should also be appreciated, that the closer the air gap, generally, there is a less likelihood of exceeding the peak or the average emission limits. However, it should also be appreciated that a small physical airgap may not be feasible in mass, low cost production, thus the need for electronic reduction in emissions.

As shown, the plot forms a second continuously increasing curve 116 where a tangent to the curve is positive from any duty cycle 10%-100%. It should be appreciated that while the duty cycle percentage 100 is graphed between 10% and 100%, the duty cycle may be less than 10%. As the duty cycle percentage 100 increases, so does the average current 112.

As an example, the duty cycle percentage 100 at 10% intersects the average current 112 at an intersection 118, which indicates that, at this duty cycle percent, the average current is approximately 0.6 mA. On the other hand, the duty cycle percentage 100 at 50% intersects the average current 112 an intersection 120, which indicates that, at this duty cycle percent, the average current 112 is approximately 2.6 mA. Further, in another example, the duty cycle percentage 100 at 100% intersects the average current 112 at an intersection 122, which indicates that, at this duty cycle percent, the average current 112 is approximately 5.0 mA. Therefore, there is a correlation between the duty cycle percentage 100 and the average current 112.

There is a reduction in the average current 112 directly correlating with the ratio of on to off time. Specifically, the reduction in the average current 112 is directly related to the percent of duty cycle percentage 100 applied to the position sensor at an airgap 114 of 1.6 mm. It should be appreciated that as the airgap 114 is changed, the correlation may also change. However, the second continuously increasing curve 116 will remain continuously increasing; thus, as the duty cycle percentage 100 increases, so does the average current 112.

As discussed previously, this reduction in average current directly reduces the sensor's current draw and the total current supplied which reduces the average radiated emissions.

Figure 7:
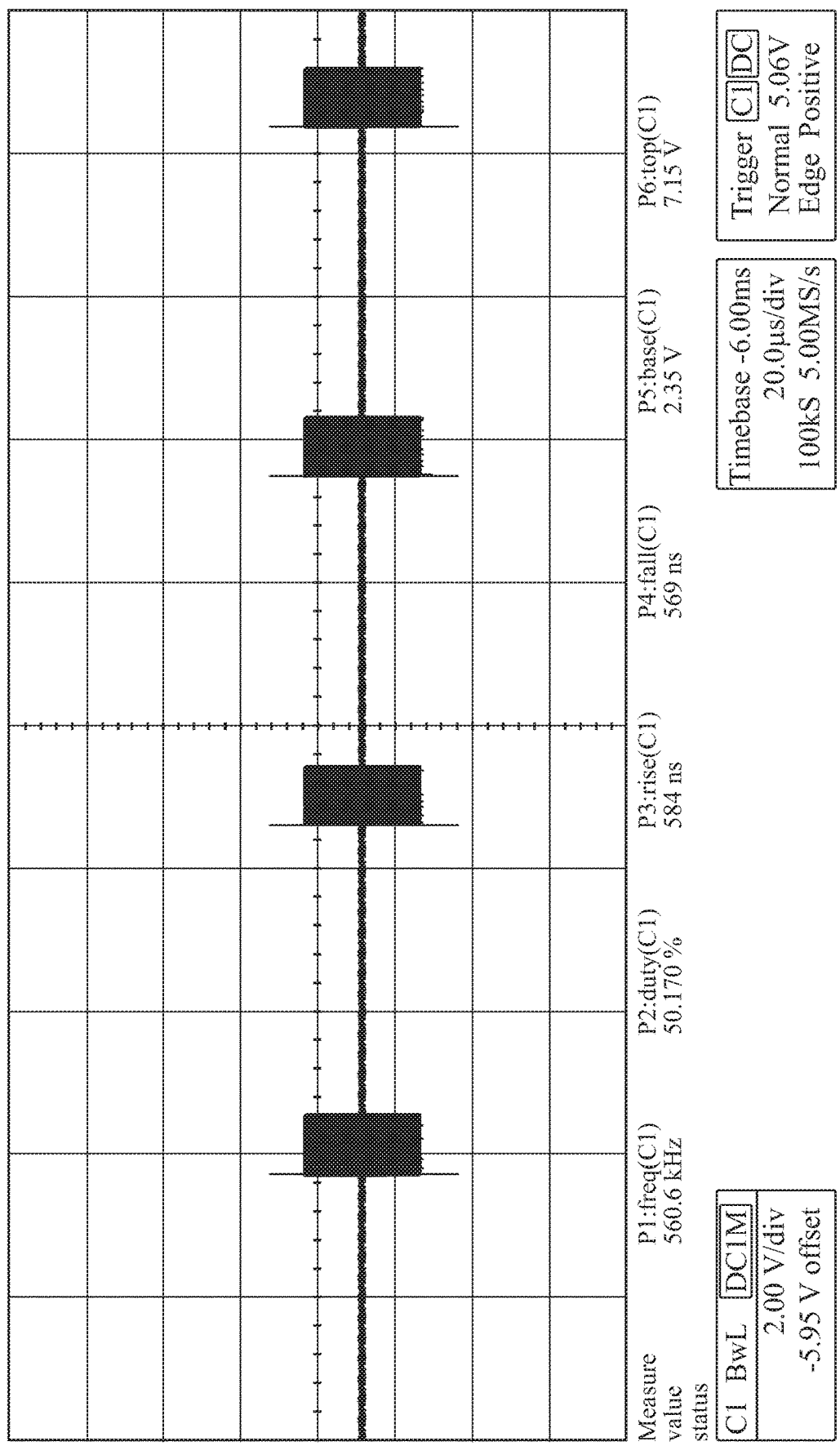
FIG. 7 schematically depicts a graphical representation of a 200 Hertz pulse width sampling graph according to one or more embodiments shown and described herein.
Figure 8:
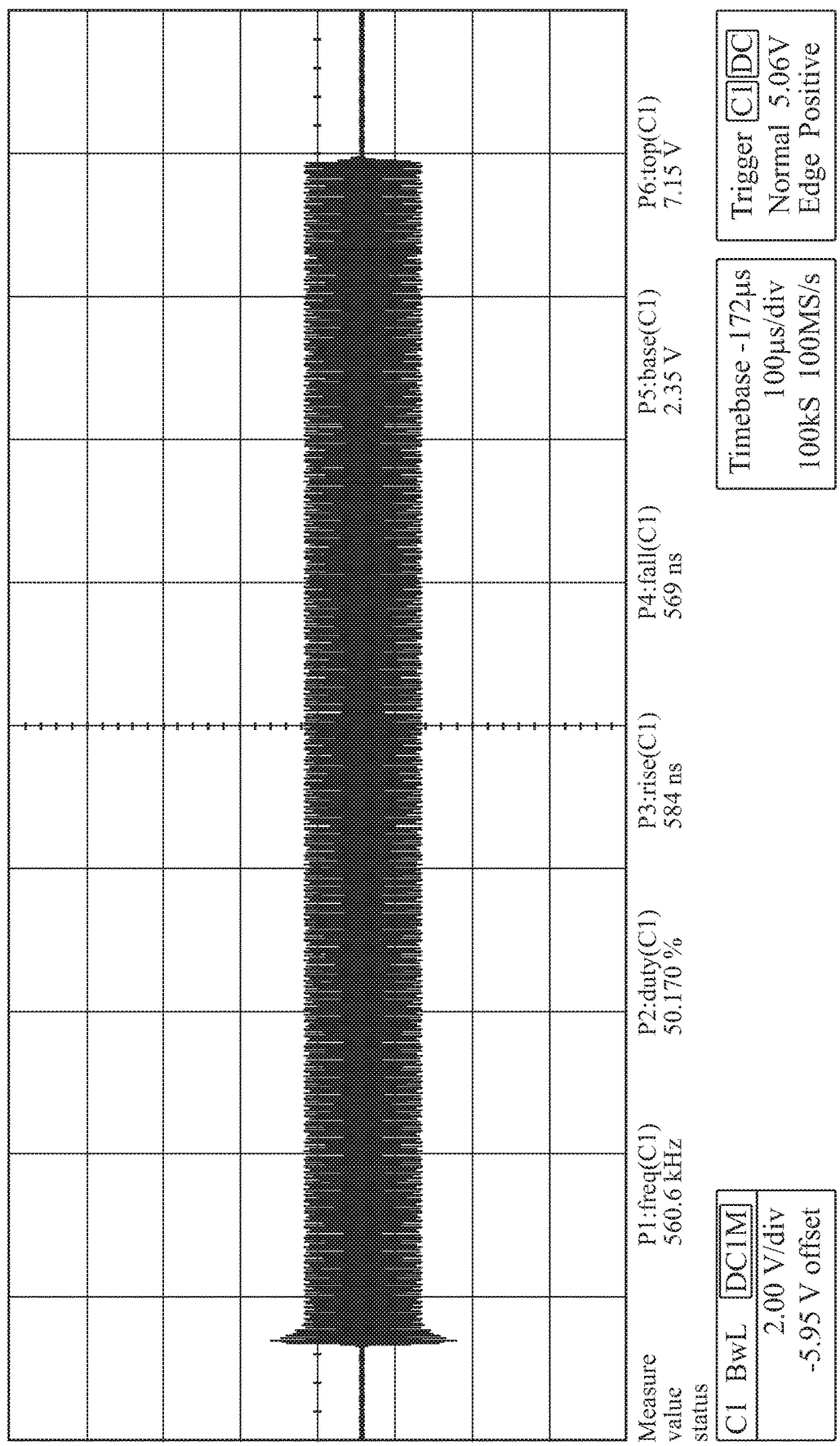
FIG. 8 schematically depicts one pulse width of the 200 Hertz pulse width sampling graph of FIG. 7 according to one or more embodiments shown and described herein.
Figure 9:
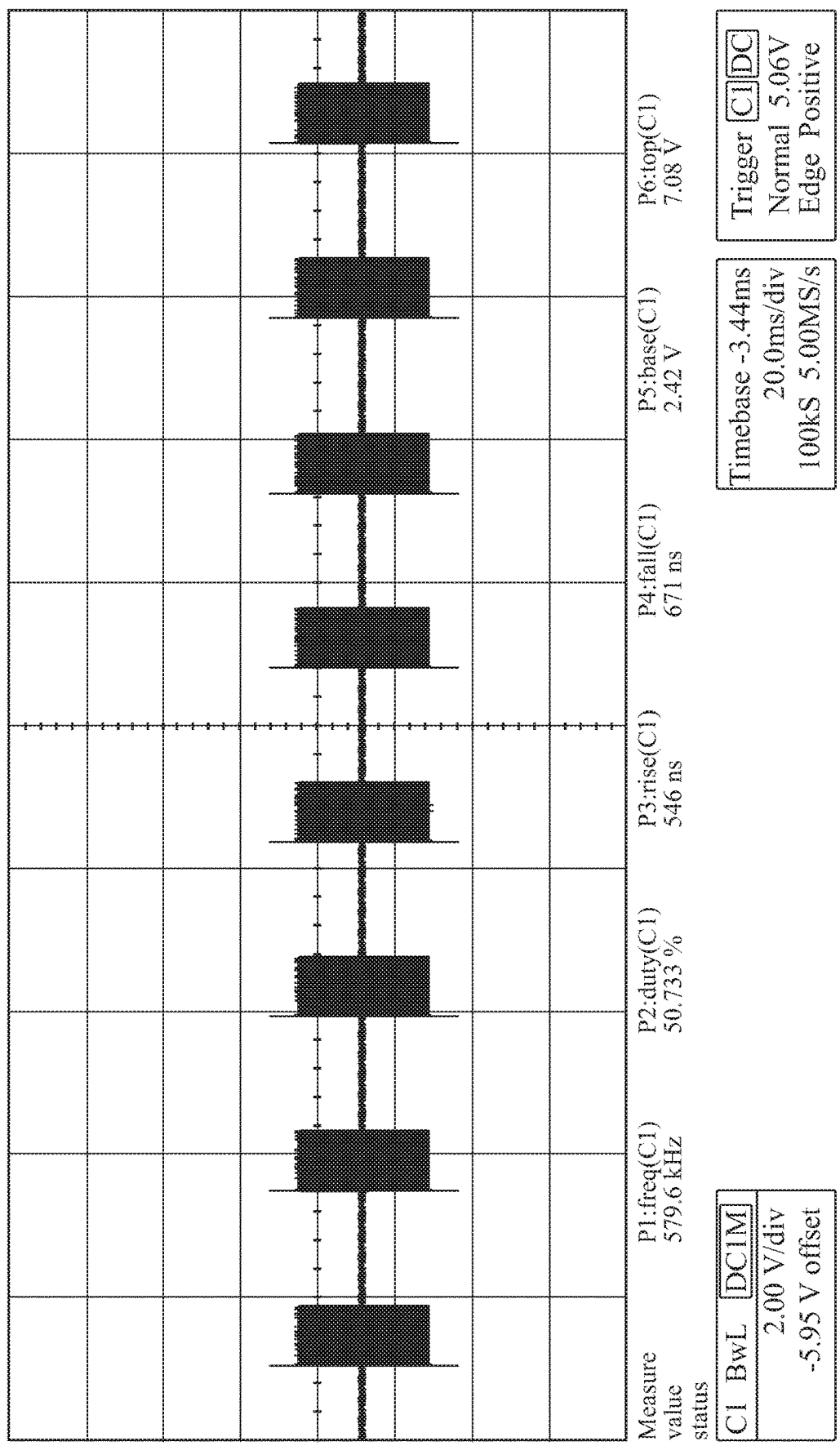
FIG. 9 schematically depicts a graphical representation of a 400 Hertz pulse width sampling graph according to one or more embodiments shown and described herein.
Figure 10:
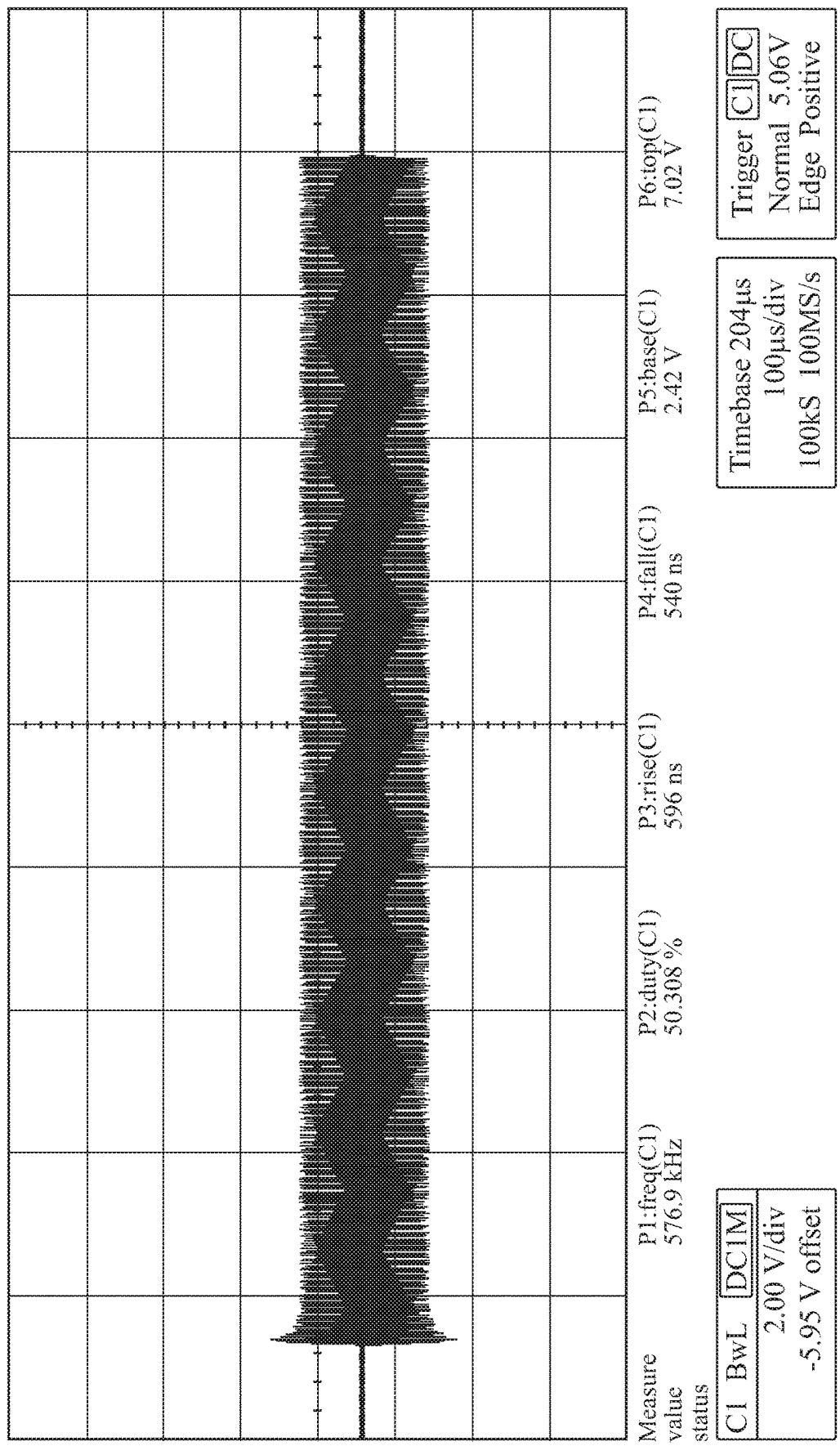
FIG. 10 schematically depicts one pulse width of the 200 Hertz pulse width sampling graph of FIG. 9 according to one or more embodiments shown and described herein.
Figure 11:
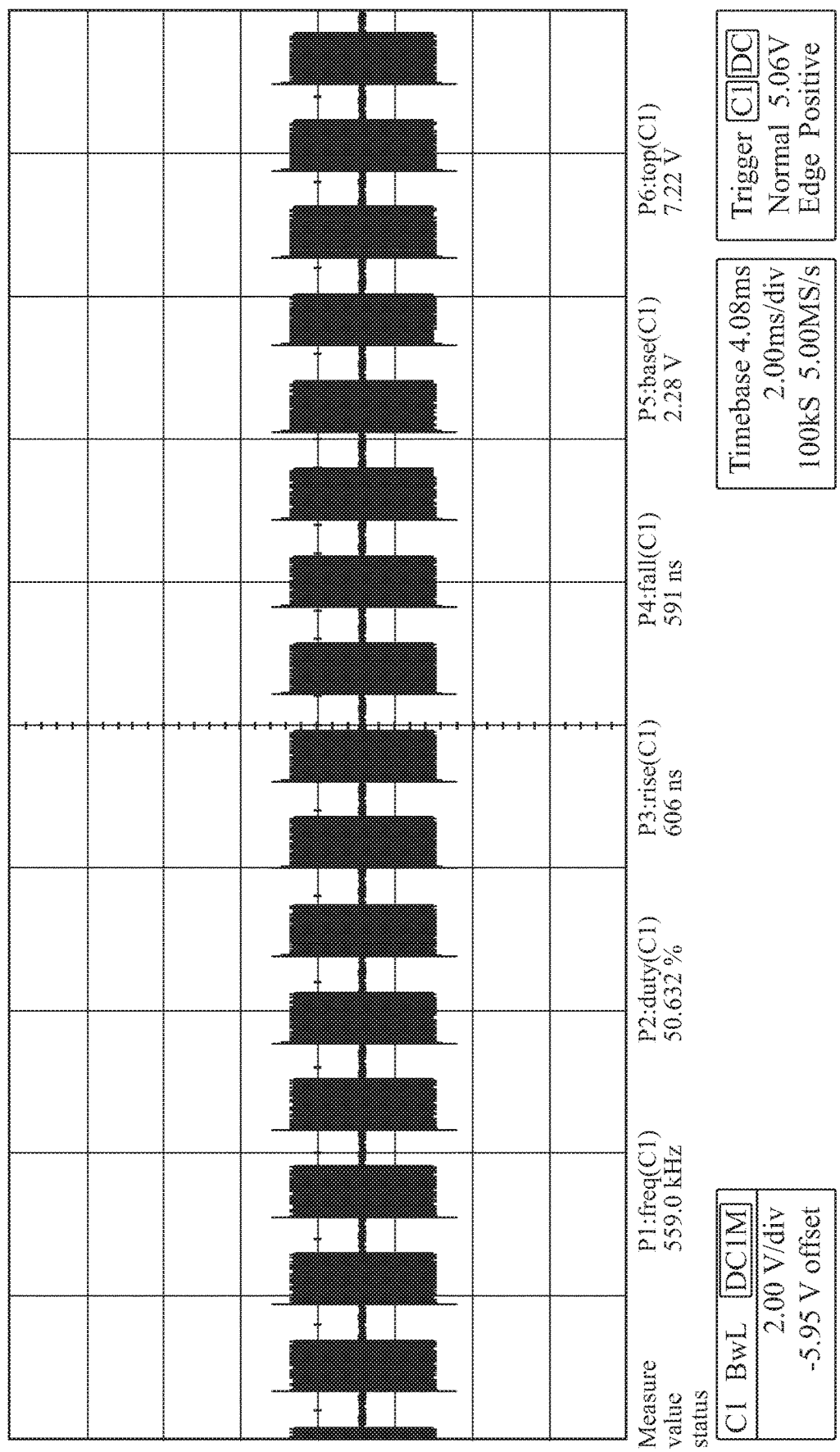
FIG. 11 schematically depicts a graphical representation of a 800 Hertz pulse width sampling graph according to one or more embodiments shown and described herein.
Figure 12:
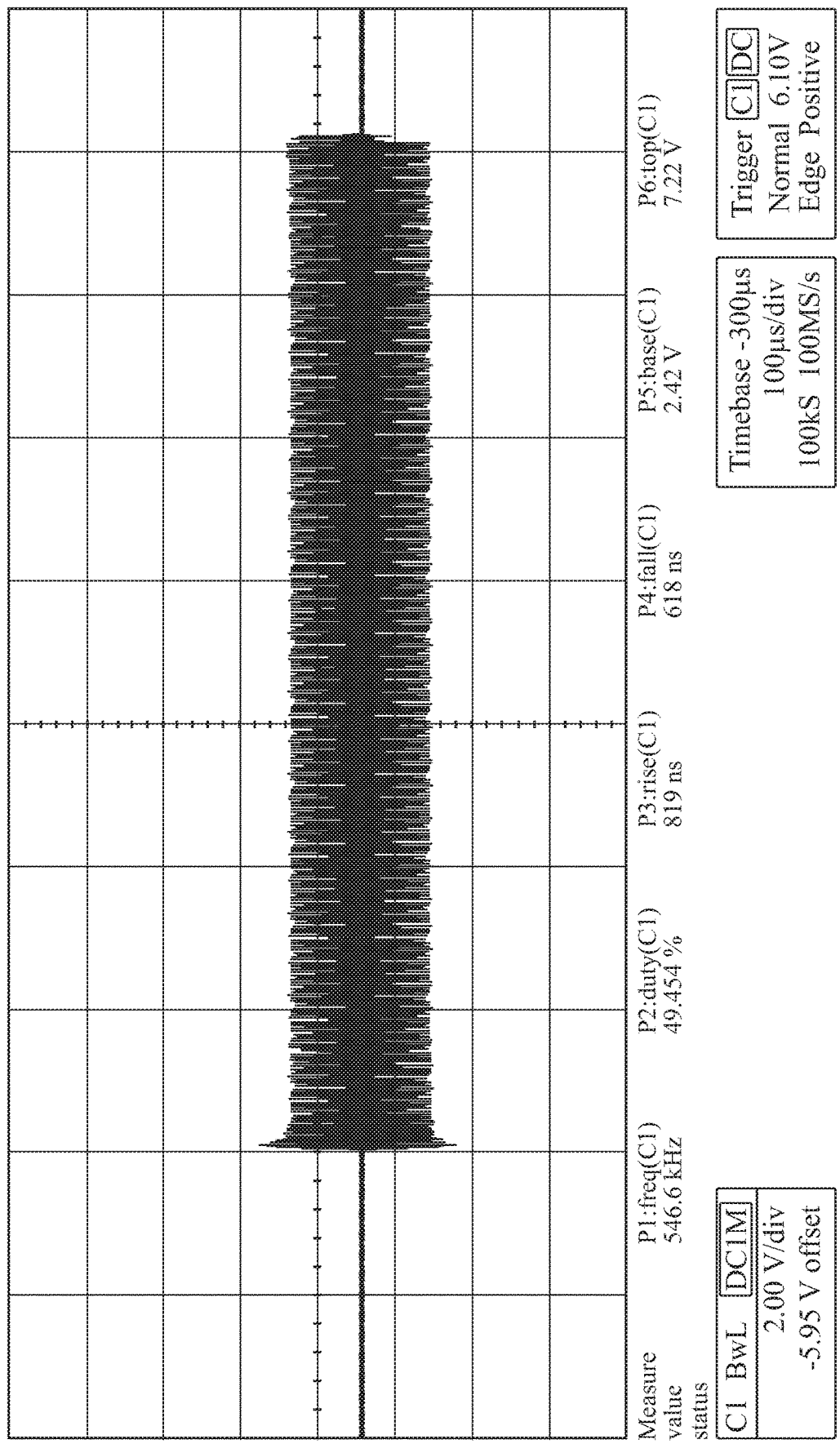
FIG. 12 schematically depicts one pulse width of the 200 Hertz pulse width sampling graph of FIG. 11 according to one or more embodiments shown and described herein.

With reference to FIGS. 7-12, frequencies are shown having the oscillator drive 14 and the duty cycle enabled together. Moreover, FIGS. 7-12 schematically depict the period of the "on" time, which may be about 800 µs fooled by a variable "off" period, which is defined by the duty cycle. In order to simplify the explanation and implementation, and not to be limiting, FIGS. 7-12 schematically depict an implementation period of ⅛, ¼, and ½ of the nominal 1600 Hz output data rate. That is, FIGS. 7 and 8 schematically depict the ⅛ ratio implementation period or 200 Hz, FIGS. 9 and 10 schematically depict the ¼ ratio implementation period or 400 Hz, and FIGS. 11 and 12 schematically depict the ½ ratio implementation period or 800 Hz. However, it should be appreciated that these ratios are not a real requirement, and the only requirement is a minimum time to allow the oscillation to become established to allow for a stable reading of the received signals.

Still referring to FIGS. 7-12, it should be seen that the oscillator drive 14 is being turned on and off at the low frequency duty cycle. The duty cycle is a low frequency of about 1 to 2 kHz. The oscillator drive 14 is turned on running at the 4 MHz, which is where the pulse width is on at 800 ms. As best seen in FIGS. 8, 10, and 12, the zoomed-in view with the pulse width on and depicted over the 800 ms cycle with the oscillator drive 14 also on. As such, and as best seen in FIG. 10, the graph appears to have a sinusoidal pattern; however, this is an aliasing effect happening because of the high frequency signal. Moreover, the pattern is a phantom pattern because over the 800 ms time period, the oscillator drive 14 generates approximately 3200 waves at 4 MHz, but only the upper peaks are needed for the sampling.

With reference to FIG. 7, a 200 Hz modulated output mode sampling graph is schematically illustrated and FIG. 8 schematically illustrates a zoomed-in view with the pulse width on and depicted over the 800 ms cycle with the oscillator drive 14 also on. As understood by those skilled in the art, a 200 Hz modulation period is 5 ms. As such, as depicted in FIG. 8, the duty cycle is on for 625 ms. However, due to system lag, the plotted time is approximately 800 ms. As such, the duty cycle is illustrated at 800 ms with an off time of 4.2 ms. As such, the oscillator drive 14 is not required to gather samples the entire 5 ms. That is, with the output of 200 Hz, the electronic control unit 58 may have a sampling rate of 1.6 kHz, as discussed above, in which the electronic control unit 58 may only gather one sample at the beginning of the duty cycle and the oscillation, after the signal settles and then may remain off, in a rest period, for the remaining 4.2 ms before needing to turn on again. The on period is consistent because it is the sampling period. That is, the sampling is much faster than what is required for the processor 62 output. Therefore, the sensor input remains constant over the entire rest period. As such, the processor 62 and the inductive position sensor 1 may have emission reductions because the current draw is not on all the time.

With reference to FIG. 9, a 400 Hz modulated output mode sampling graphs is schematically illustrated and FIG. 10 schematically illustrates a zoomed-in view of one pulse width on of FIG. 9 and depicted over the 800 ms cycle with the oscillator drive 14 also on. As discussed above, and understood by those skilled in the art, a 400 Hz modulation period is 2.5 ms. As such, as depicted in FIG. 9, the duty cycle is still on for approximately 800 ms and off for 1.7 ms. As such, the oscillator drive 14 is not required to gather samples the entire 2.5 ms, but may instead gather the sample during the 800 ms and then rest for the remaining 1.7 ms before needing to turn on again. Again, the on time is consistent and the inductive position sensor 1 input remains constant over the entire rest period. As such, the processor 62 and the inductive position sensor 1 may have emission reductions because the current draw is not on all the time.

With reference to FIG. 11, a 800 Hz modulated output mode sampling graphs is schematically illustrated and FIG. 12 schematically illustrates a zoomed-in view of one pulse width on of FIG. 11 and depicted over the 800 ms cycle with the oscillator drive 14 also on. As discussed above, and understood by those skilled in the art, an 800 Hz modulation period is 1.25 ms. As such, as depicted in FIG. 11, the duty cycle is still on for approximately 800 ms and off for 0.45 ms. As such, the oscillator drive 14 is not required to gather samples the entire 1.25 ms, but may instead gather the sample during the 800 ms and then rest for the remaining 0.45 ms before needing to turn on again. Again, the on time is consistent and the inductive position sensor 1 input remains constant over the entire rest period. As such, the processor 62 and the inductive position sensor 1 may have emission reductions because the current draw is not on all the time.

As should be appreciated by those skilled in the art, the reduction of radiated emissions using a duty cycle and/or modulation, does not impact the hardware of the position sensor. Further, due to the slow speed of typical position sensing in the 2 KHz range compared to sampling and startup speed of the sensor, the higher operating frequency, in the 4 MHz range, may be used and output date at the slower rate using modulation, while still maintaining a higher internal sample rate.

I claim:

1. A position sensor system comprising:
   an inductive position sensor having a transmitting coil and at least one receiving coil;
   a coupler configured to move relative to the transmitting coil and the at least one receiving coil;
   an electronic control unit comprising an oscillator drive, the electronic control unit operably connected to the oscillator drive, the oscillator drive enables an oscillation signal configured to enable the inductive position sensor at a predetermined time;
   a pulse-width modulation controlled by the electronic control unit, the pulse-width modulation having a start duty cycle and a stop duty cycle controlled by the electronic control unit at a predetermined period of time, the pulse-width modulation operating at a predefined frequency and at a predefined ratio;
   wherein, the inductive position sensor transmits a sample to the electronic control unit when the oscillation signal and the start duty cycle are both enabled, the sample being a position of the coupler relative to the inductive position sensor;
   wherein, the start duty cycle and the stop duty cycle are configured to reduce an average radiated emission of the inductive position sensor.

2. The position sensor system of claim 1, wherein the predetermined time is a minimum time required for the inductive position sensor to transmit a stable sample.

3. The position sensor system of claim 1, wherein the sample is held by the electronic control unit until a second sample is taken during a next period of time when the oscillation signal and the start duty cycle are both enabled.

4. The position sensor system of claim 1, wherein the coupler is spaced apart from the transmitting coil and the at least one receiving coil so to form an airgap.

5. The position sensor system of claim 4, wherein the air gap between the transmitter coil and the coupler is greater than 1.0 millimeter.

6. The position sensor system of claim 1, wherein the pulse-width modulation is at the predefined frequency of 400 hertz.

7. The position sensor system of claim 1, wherein the pulse-width modulation is at the predefined frequency of 200 hertz.

8. The position sensor system of claim 1, wherein the pulse-width modulation is at the predefined frequency of 800 hertz.

9. The position sensor system of claim 1, wherein the predetermined period of time between the start duty cycle to the stop duty cycle is equal to 10 percent.

10. The position sensor system of claim 1, wherein the predetermined period of time between the start duty cycle to the stop duty cycle is greater than 10 percent.

11. The position sensor system of claim 1, wherein the predetermined period of time between the start duty cycle to the stop duty cycle is less than 10 percent.

12. A sensor system comprising:
an inductive position sensor having a transmitting coil and at least one receiving coil;
a coupler configured to move relative to the transmitting coil and the at least one receiving coil;
an electronic control unit comprising an oscillator drive, the electronic control unit operably connected to the oscillator drive, the oscillator drive operably connected to the inductive position sensor so to transmit an oscillating signal;
a pulse width modulation signal having a duty cycle, the pulse width modulation signal controlled by the electronic control unit at a predetermined period of time, the duty cycle operating at a predefined proportion of time;
wherein a sample of the inductive position sensor position is obtained when the oscillating signal and the duty cycle are both enabled such that only a single sample is required for the predefined proportion of time, the sample being a position of the coupler relative to the inductive position sensor, wherein the oscillator drive is inhibited a remaining time of the predefined proportion of time so to reduce power consumption and emissions of the inductive position sensor.

13. The position sensor system of claim 12, wherein the predetermined time is a minimum time required for the inductive position sensor to transmit a stable sample.

14. The position sensor system of claim 13, wherein the sample is held by the electronic control unit until a second sample is taken during a next period of time when the oscillation signal and the duty cycle are both enabled.

15. The position sensor system of claim 12, wherein the coupler is spaced apart from the transmitting coil and the at least one receiving coil so to form an airgap.

16. The position sensor system of claim 15, wherein the air gap between the transmitter coil and the coupler is greater than 1.0 millimeter.

17. The position sensor system of claim 12, wherein the duty cycle is a periodic clock signal, the predetermined period of time of the periodic clock signal is 10 percent.

18. The position sensor system of claim 12, wherein the duty cycle is a periodic clock signal the predetermined period of time of the periodic clock signal is greater than 10 percent.

19. The position sensor system of claim 12, wherein the duty cycle is a periodic clock signal, the predetermined period of time of the periodic clock signal is less than 10 percent.

20. The position sensor system of claim 12, wherein repeat multiples of the sample of the inductive position sensor position are processed by the electronic control unit until the oscillation signal and the duty cycle both change states.

* * * * *